US010204815B2

United States Patent
Yang et al.

(10) Patent No.: US 10,204,815 B2
(45) Date of Patent: Feb. 12, 2019

(54) VACUUM ADSORPTION SYSTEM, METHOD AND PACKAGING DEVICE FOR MOTHER SUBSTRATE TO BE PACKAGED

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 275 days.

(21) Appl. No.: 14/785,641

(22) PCT Filed: Apr. 16, 2015

(86) PCT No.: PCT/CN2015/076707
§ 371 (c)(1),
(2) Date: Oct. 20, 2015

(87) PCT Pub. No.: WO2016/062038
PCT Pub. Date: Apr. 28, 2016

(65) Prior Publication Data
US 2016/0254175 A1    Sep. 1, 2016

(30) Foreign Application Priority Data

Oct. 22, 2014 (CN) .......................... 2014 1 0568435

(51) Int. Cl.
*H01L 51/56* (2006.01)
*H01L 21/683* (2006.01)
(Continued)

(52) U.S. Cl.
CPC .... *H01L 21/6838* (2013.01); *H01L 21/67126* (2013.01); *H01L 21/67259* (2013.01); *H01L 21/68* (2013.01); *H01L 51/56* (2013.01)

(58) Field of Classification Search
CPC ......... H01L 27/32; H01L 51/52; H01L 51/56; H01L 21/67126; H01L 21/67259; H01L 21/68; H01L 21/6838
See application file for complete search history.

(56) References Cited

U.S. PATENT DOCUMENTS

2008/0148558 A1    6/2008  Oh

FOREIGN PATENT DOCUMENTS

CN    102184935 A  *  9/2011
CN    102610399 A     7/2012
(Continued)

OTHER PUBLICATIONS

International Search Report dated Jul. 23, 2015 corresponding to International application No. PCT/CN2015/076707.
(Continued)

*Primary Examiner* — Carl Arbes
(74) *Attorney, Agent, or Firm* — Nath, Goldberg & Meyer; Joshua B. Goldberg

(57) ABSTRACT

Vacuum adsorption system of the invention includes: vacuum adsorption platform; carrying platform, which is provided on vacuum adsorption platform and edges thereof are sealed with edges of vacuum adsorption platform, configured to carrying mother substrate to be packaged and provided thereon with a plurality of adsorption units used for adsorbing and fixing, in cooperation with vacuum adsorption platform, mother substrate to be packaged; detection unit, configured to detect positional relationships between adsorption units on carrying platform and packaging areas on mother substrate to be packaged; and adjustment unit, (Continued)

configured to adjust position of carrying platform when detection unit detects that positions of adsorption units on carrying platform are overlapped with packaging areas on mother substrate to be packaged, so that positions of at least part of adsorption units on carrying platform are not overlapped with packaging areas on mother substrate to be packaged.

17 Claims, 2 Drawing Sheets

(51) Int. Cl.
    *H01L 21/68*     (2006.01)
    *H01L 21/67*     (2006.01)

(56) References Cited

FOREIGN PATENT DOCUMENTS

| | | |
|---|---|---|
| CN | 104040688 A | 9/2014 |
| CN | 104377157 A | 2/2015 |
| JP | 8-136877 | 5/1996 |
| JP | H8-136811 A | 5/1996 |
| KR | 10-2012-0125418 | 11/2012 |
| KR | 10-2012-0125418 A | 11/2012 |

OTHER PUBLICATIONS

Written Opinion of the International Searching Authority dated Jul. 23, 2015 corresponding to International application No. PCT/CN2015/076707.
Office Action dated Apr. 17, 2017 issued in corresponding Korean Application No. 10-2015-7033165.
Office Action dated Nov. 7, 2016 issued in corresponding Chinese Application No. 201410568435.6.
Extended European Search Report dated May 22, 2018 in corresponding European Patent Application No. EP 15787886.9.

* cited by examiner

VACUUM ADSORPTION SYSTEM, METHOD AND PACKAGING DEVICE FOR MOTHER SUBSTRATE TO BE PACKAGED

This is a National Phase Application filed under 35 U.S.C. 371 as a national stage of PCT/CN2015/076707, filed Apr. 16, 2015, an application claiming the benefit of Chinese Application No. 201410568435.6, filed Oct. 22, 2014, the content of each of which is hereby incorporated by reference in its entirety.

FIELD OF THE INVENTION

The present invention relates to the field of substrate packaging technology, and particularly, to a vacuum adsorption system for a mother substrate to be packaged, a packaging device including the vacuum adsorption system and an adsorption method for the vacuum adsorption system.

BACKGROUND OF THE INVENTION

As a novel display device, Organic Light-emitting Diode (OLED) display device has the advantages of good color saturation and wide angle of view. However, luminescent and function materials within the display device are sensitive to moisture and oxygen, where the parameter requirements for moisture resistance and oxygen resistance of the corresponding products are in that: permeability of oxygen is required to be less than $10^{-3}$ cc/m$^2$/day and permeability of moisture is required to be less than $10^{-6}$ g/m$^2$/day. Currently, OLED display devices in middle or small size are packaged by means of printing frit.

As shown in FIG. 1, packaging by means of printing frit includes the following steps: placing first a mother substrate 20 to be packaged on a vacuum adsorption platform 10 of a vacuum adsorption system, and then adsorbing, by vacuumizing, the mother substrate 20 to be packaged to fix it on the vacuum adsorption platform 10; subsequently, placing an alignment substrate (Mask substrate, not shown in FIG. 1), which is used for determining positions of frit, on the mother substrate 20 to be packaged, and then printing the frit to the mother substrate 20 to be packaged along grooves of the alignment substrate; finally, removing the alignment substrate and packaging another mother substrate with the mother substrate 20 to be packaged, so as to form a package assembly. It should be noted that, a plurality of grooves, which may be in a rectangular ring shape, are provided on the alignment substrate, and area on the mother substrate 20 to be packaged may be divided into a plurality of display areas 22, a plurality of packaging areas 21 and a plurality of cutting areas 23, wherein the size, shape and position of each of the grooves on the alignment substrate correspond to those of a packaging area 21 on the mother substrate 20 to be packaged and thus the packaging area 21 may be in a rectangular ring shape as well, as shown in FIG. 1. The area surrounded by one packaging area 21 is one display area 22, and the areas between adjacent packaging areas 21 are the cutting areas 23, wherein a plurality of display panels can be formed by cutting the package assembly that has been packaged along the cutting areas 23.

The inventors have found that at least the following problems exist in the prior art. Most of vacuum adsorption systems used in the prior art adopt grooves or adsorption holes on the vacuum adsorption platforms. A common disadvantage to these two types of vacuum adsorption platforms is that positions on the mother substrate to be packaged (i.e., the packaging areas on the mother substrate to be packaged) on the vacuum adsorption platform corresponding to the grooves on the alignment substrate will be deformed due to action of the adsorption force from the vacuum adsorption platform, which in turn causes large step on the surface of the printed frit, so that poor packaging due to untightness may occur when packaging the mother substrate to be packaged with another mother substrate and thus the service life of the display device will be affected.

SUMMARY OF THE INVENTION

In view of the problems in the existing vacuum adsorption systems, the present invention provides a vacuum adsorption system, an adsorption method and a packaging device used for a mother substrate to be packaged, so that the surface of the printed frit on the mother substrate to be packaged may be flat, and the mother substrate to be packaged can be packaged properly with another mother substrate.

As an aspect of the present invention, there is provided a vacuum adsorption system used for a mother substrate to be packaged, which includes a vacuum adsorption platform, and the vacuum adsorption system further includes:

a carrying platform, which is provided on the vacuum adsorption platform and edges thereof are sealed with edges of the vacuum adsorption platform, configured to carrying the mother substrate to be packaged and provided thereon with a plurality of adsorption units, the adsorption units being used for adsorbing, in cooperation with the vacuum adsorption platform, the mother substrate to be packaged so as to fix the mother substrate to be packaged;

a detection unit, configured to detect positional relationships between the adsorption units on the carrying platform and packaging areas on the mother substrate to be packaged; and an adjustment unit, configured to adjust the position of the carrying platform when the detection unit detects that the positions of the adsorption units on the carrying platform are overlapped with the packaging areas on the mother substrate to be packaged, so that positions of at least part of the adsorption units on the carrying platform are not overlapped with the packaging areas on the mother substrate to be packaged.

The plurality of adsorption units may be distributed uniformly on the carrying platform.

The structure of the adsorption unit may be a round hole, a square hole or a rectangular hole.

The detection unit may be an optical range unit.

The vacuum adsorption system may further include:

a control unit, configured to control the adjustment unit to adjust the position of the carrying platform based on the positional relationships between the positions of the adsorption units on the carrying platform and the packaging areas on the mother substrate to be packaged output by the detection unit, such that the positions of at least part of the adsorption units on the carrying platform are not overlapped with the packaging areas of the mother substrate to be packaged.

The vacuum adsorption system may further include:

a vacuumizing device, configured to enable the mother substrate to be packaged to be adsorbed and fixed on the carrying platform through adsorption holes on the vacuum adsorption platform and the adsorption units on the carrying platform.

As another aspect of the present invention, there is provided a packaging device including the above vacuum adsorption system.

As yet another aspect of the present invention, there is provided an adsorption method for a vacuum adsorption system, which is the vacuum adsorption system as described above, and the adsorption method includes the following steps of:

placing the mother substrate to be packaged above the carrying platform;

detecting the positional relationships between the adsorption units on the carrying platform and the packaging areas on the mother substrate to be packaged, and if it is detected that the positions of the adsorption units on the carrying platform are not overlapped with the packaging areas on the mother substrate to be packaged, the position of the carrying platform is kept as it is; and if it is detected that the positions of the adsorption units on the carrying platform are overlapped with the packaging areas on the mother substrate to be packaged, the following step is performed; and adjusting the position of the carrying platform, such that at least part of the adsorption units on the carrying platform are not overlapped with the packaging areas on the mother substrate to be packaged.

The step of detecting the positional relationships between the adsorption units on the carrying platform and the packaging areas on the mother substrate to be packaged may be a step of detecting distances between each adsorption unit on the carrying platform and a packaging area on the mother substrate to be packaged adjacent to the adsorption unit.

After the step of adjusting the position of the carrying platform, such that at least part of the adsorption units on the carrying platform are not overlapped with the packaging areas on the mother substrate to be packaged, the method may further include the following step of:

adsorbing the mother substrate to be packaged onto the carrying platform through vacuumizing.

Compared to the prior art, the carrying platform has been added to the vacuum adsorption system of the present invention, by which the case that the vacuum adsorption platform in the prior art directly contacts and carries the mother substrate to be packaged is avoided. Further, to avoid the problems in the prior art, the detection unit and the adjustment unit are added, through which the positional relationships between the packaging areas on the mother substrate to be packaged and the adsorption units on the carrying platform can be detected, and when they are overlapped with each other, the position of the carrying platform can be adjusted, so that the packaging areas on the mother substrate to be packaged are not overlapped with the positions of at least part of the adsorption units on the carrying platform, which in turn allows the mother substrate to be packaged to have a flat surface after being printed with frit and can be packaged properly with another mother substrate to form a package assembly, such that devices between the mother substrates can be sealed properly.

At least part of the adsorption units on the carrying platform can be caused to not overlap with the packaging areas on the mother substrate to be packaged according to the adsorption method for the vacuum adsorption system of the present invention, and in this way, the surface of the printed frit on the mother substrate to be packaged may be flat, and the mother substrate to be packaged may be packaged with another mother substrate properly without gaps at packaged positions, such that devices packaged between the mother substrates can have longer service lives and be safe.

DETAILED DESCRIPTION OF THE EMBODIMENTS

To make those skilled in the art better understand the technical solutions of the present invention, the present invention will be further described in conjunction with the accompanying drawings and specific implementations.

Embodiment 1

Figure 2:
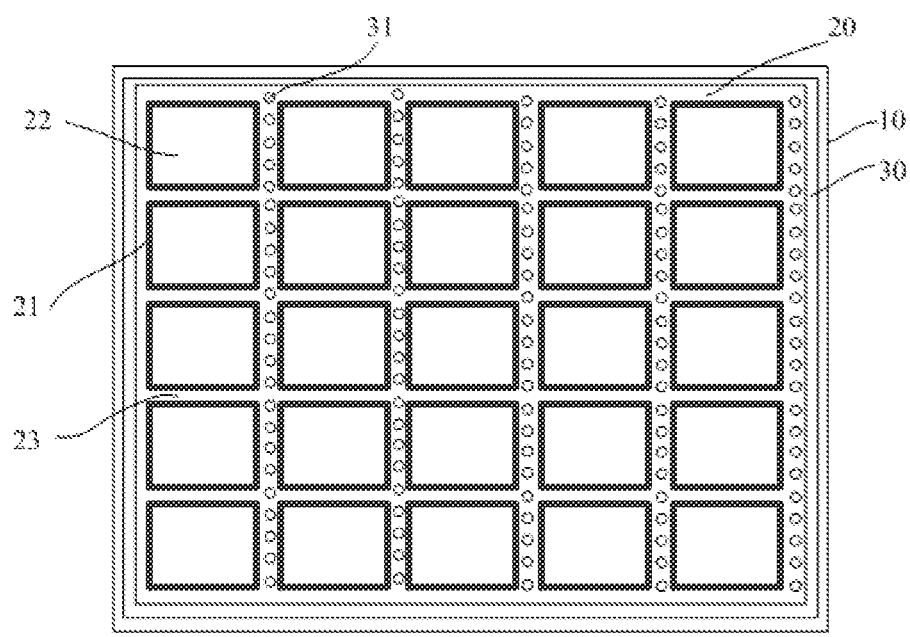
FIG. 2 is a schematic diagram of a vacuum adsorption system of Embodiment 1 of the present invention.

As shown in FIG. 2, the present embodiment provides a vacuum adsorption system used for a mother substrate 20 to be packaged, which may be packaged with another mother substrate to form a package assembly, and a plurality of display panels may be formed by cutting the package assembly. The vacuum adsorption system includes a vacuum adsorption platform 10, a carrying platform 30 that is provided on the vacuum adsorption platform 10 and edges thereof are sealed with edges of the vacuum adsorption platform 10, a detection unit and an adjustment unit. The carrying platform 30 is configured to carry the mother substrate 20 to be packaged and is provided thereon with a plurality of adsorption units 31, and the adsorption units 31 are configured to cooperate with the vacuum adsorption platform 10 to adsorb the mother substrate 20 to be packaged so as to fix it; the detection unit is configured to detect the positional relationships of the adsorption units 31 on the carrying platform 30 and packaging areas 21 on the mother substrate 20 to be packaged; and the adjustment unit is configured to adjust position of the carrying platform 30 when the detection unit detects that the positions of the adsorption units 31 on the carrying platform 30 are overlapped with the packaging areas 21 on the mother substrate 20 to be packaged, so that positions of at least part of the adsorption units 31 on the carrying platform 30 are not overlapped with the packaging areas 21 on the mother substrate 20 to be packaged.

Compared to the prior art, the carrying platform 30 has been added to the vacuum adsorption system of the present embodiment, by which the case that the vacuum adsorption platform 10 in the prior art directly contacts and carries the mother substrate 20 to be packaged is avoided. Further, to avoid the problems in the prior art, the detection unit and the adjustment unit are added, through which relationships between positions of the packaging areas 21 on the mother substrate 20 to be packaged and positions of the adsorption units 31 on the carrying platform 30 can be detected, and when the positions of the packaging areas 21 on the mother substrate 20 to be packaged and the positions of the adsorption units 31 on the carrying platform 30 are overlapped with each other, the position of the carrying platform 30 may be adjusted, so that the packaging areas 21 on the mother substrate 20 to be packaged are not overlapped with positions of at least part of the adsorption units 31 on the carrying platform 30, which in turn allows the mother substrate to be packaged 10 to have a flat surface after being printed with frit (which is printed within the packaging areas 21 on the mother substrate 20 to be packaged) and may be properly packaged with another mother substrate to form a package assembly, so that devices between the mother substrates may be packaged hermetically and properly.

It should be noted that, the area on the mother substrate 20 to be packaged may be divided into a plurality of display areas 22, a plurality of packaging areas 21 and a plurality of cutting areas 23, wherein each of the packaging areas 21 may be in a rectangular ring shape (as shown in FIG. 2), the area surrounded by one packaging area 21 is one display area 22, and the areas between the adjacent packaging areas 21 are the cutting areas 23, along which the package assembly is cut to form a plurality of display panels. The adjustment unit can adjust the carrying platform 30 so as to move in a horizontal direction or vertical direction. Herein, "move in a horizontal direction or vertical direction" refers to move in the same plane, so that when the position of the carrying platform 30 is adjusted by the adjustment unit, the positions corresponding to the adsorption units 31 on the carrying platform 30 can be adjusted to correspond to the cutting areas 23 on the mother substrate to be packaged 23, so as to keep away from the packaging areas 21 on the mother substrate 20 to be packaged.

Preferably, the plurality of adsorption units 32 on the carrying platform 30 are distributed uniformly on the carrying platform 30, so that the mother substrate 20 to be packaged that is adsorbed on the carrying platform 30 is subjected to a more uniform adsorption force, which prevents the mother substrate to be packaged from being damaged due to application of uneven force. Further preferably, structure of the adsorption unit 31 may be a round hole, a square hole or a rectangular hole, and needless to say, the structure of the adsorption unit 31 is not limited to these three shapes, but may be in a shape of opening or groove.

Preferably, the detection unit in the present embodiment is an optical range unit, and the optical range unit may be used to detect a distance between the packaging area 21 on the mother substrate 20 to be packaged and the adsorption unit 31 on the carrying platform 30. It should be noted that, this distance refers to a distance between the packaging area 21 on the mother substrate to be packaged and the adsorption unit 31 adjacent thereto. The adjustment unit can adjust the position of the carrying platform 30 according to information of the distance, such that positions of at least part of the adsorption units 31 on the carrying platform 30 can be not overlapped with the packaging areas 21 on the mother substrate 20 to be packaged.

Preferably, the vacuum adsorption system further includes a control unit, which is configured to control the adjustment unit to adjust the position of the carrying platform 30 based on the positional relationships between the positions of the adsorption units 31 and the packaging areas 21 on the mother substrate to be packaged output by the detection unit, such that positions of at least part of the adsorption units 31 on the carrying platform 30 can be not overlapped with the packaging areas 21 on the mother substrate 20 to be packaged. The control unit may be a microprocessor or a PLC (Programmable Logic Controller) device.

Needless to say, the vacuum adsorption system in this embodiment further includes a vacuumizing device, and the vacuumizing device is configured to enable the mother substrate 20 to be packaged to be adsorbed and fixed on the carrying platform 30 through adsorption holes (or other structures for adsorption) on the vacuum adsorption platform 10 and the adsorption units 31 on the carrying platform 30.

Accordingly, the present embodiment further provides a packaging device, which includes the above described vacuum adsorption system.

Embodiment 2

The present embodiment provides an adsorption method for a vacuum adsorption system, which may be the vacuum adsorption system as described in Embodiment 1. The adsorption method will be described in details below in conjunction with FIG. 2.

The adsorption method specifically includes the following steps of S01 to S04.

At step S01, a mother substrate 20 to be packaged is placed above a carrying platform 30.

In this step, the mother substrate 20 to be packaged may be suspended above the carrying platform 30 by a mechanical arm, and distance between the mother substrate 20 to be packaged and the carrying platform 30 should not be too large, otherwise, inaccuracies may occur in subsequent steps.

At step S02, the positional relationships between the adsorption units 31 on the carrying platform 30 and the packaging areas 21 on the mother substrate 20 to be packaged are detected.

The specifically procedure of this step is: detecting a distance between the adsorption unit 31 on the carrying platform 30 and the packaging area 21 on the mother substrate 20 to be packaged adjacent thereto, so as to determine the positional relationship between the adsorption unit 31 on the carrying platform 30 and the packaging area 21 on the mother substrate 20 to be packaged adjacent thereto.

If it is detected that the positions of the adsorption units 31 are not overlapped with the packaging areas 21 on the mother substrate 20 to be packaged, the position of the carrying platform 30 is kept as it is; and if it is detected that the positions of the adsorption units 31 are overlapped with the packaging areas 21 on the mother substrate 20 to be packaged, the next step is performed.

At step S03, if it is detected that the positions of the adsorption units 31 are overlapped with the packaging areas 21 on the mother substrate 20 to be packaged, the position of the carrying platform 30 is adjusted, such that at least part of the adsorption units 31 thereon are not overlapped with the packaging areas 21 on the mother substrate 20 to be packaged.

At step S04, the mother substrate 20 to be packaged is adsorbed onto the carrying platform 30 by vacuumizing.

According to the adsorption method for the vacuum adsorption system in the present embodiment, at least part of the adsorption units 31 on the carrying platform 30 can be not overlapped with the packaging areas 21 on the mother substrate 20 to be packaged, and in this way, the surface of the printed frit on the mother substrate to be packaged may be flat, and the mother substrate to be packaged may be packaged with another mother substrate properly without gaps at packaged positions, such that devices packaged between the mother substrates may have longer service lives and be safe.

Figure 1:
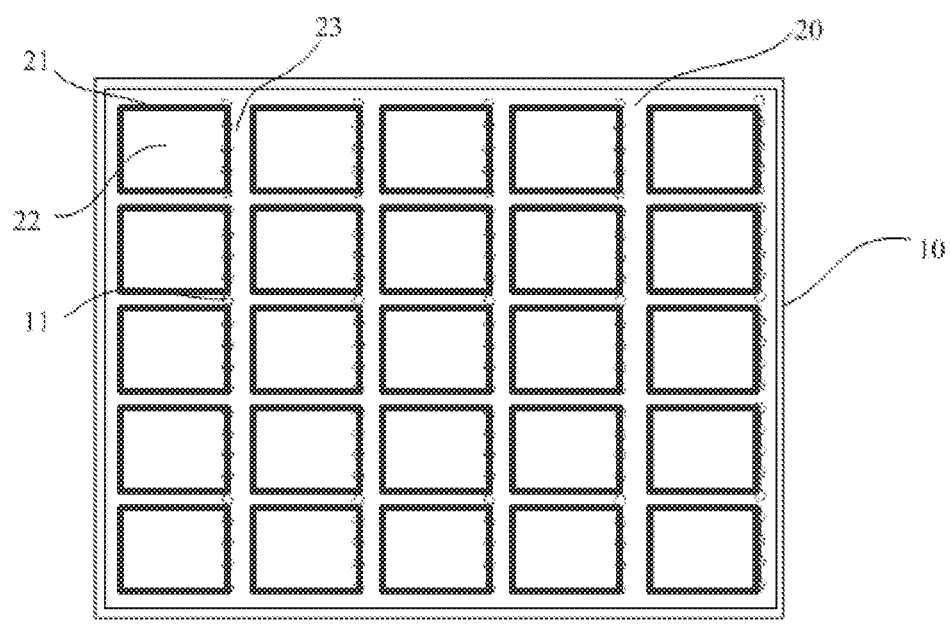
FIG. 1 is a schematic diagram of an existing vacuum adsorption system.

FIGS. 1 and 2 are simply schematic diagrams, and only part of adsorption holes 11/adsorption units 31 are illustrated for ease of understanding. It should be understood that a plurality of adsorption holes 11/adsorption units 31 in rows/columns are provided on the vacuum adsorption platform 10/carrying platform 30.

It should be understood that the foregoing implementations are merely the exemplary embodiments used for explaining the principle of the present invention, and the present invention is not limited thereto. Various variations and improvements can be made by those skilled in the art without departing from the spirit and essence of the present invention, and these variations and improvements should also fall within the protection scope of the present invention.

What is claimed is:

1. A vacuum adsorption system for a mother substrate to be packaged, which includes a vacuum adsorption platform, wherein the vacuum adsorption system further includes:
   a carrying platform, which is provided on the vacuum adsorption platform and edges thereof are sealed with edges of the vacuum adsorption platform, configured to carrying the mother substrate to be packaged and provided thereon with a plurality of adsorption units, the adsorption units being used for adsorbing, in cooperation with the vacuum adsorption platform, the mother substrate to be packaged so as to fix the mother substrate to be packaged;
   a detection unit, configured to detect positional relationships between the adsorption units on the carrying platform and packaging areas on the mother substrate to be packaged; and
   an adjustment unit, configured to adjust the position of the carrying platform when the detection unit detects that the positions of the adsorption units on the carrying platform are overlapped with the packaging areas on the mother substrate to be packaged, so that positions of at least part of the adsorption units on the carrying platform are not overlapped with the packaging areas on the mother substrate to be packaged.

2. The vacuum adsorption system according to claim 1, wherein the plurality of adsorption units are distributed uniformly on the carrying platform.

3. The vacuum adsorption system according to claim 2, wherein the structure of the adsorption unit is a round hole, a square hole or a rectangular hole.

4. The vacuum adsorption system according to claim 1, wherein the structure of the adsorption unit is a round hole, a square hole or a rectangular hole.

5. The vacuum adsorption system according to claim 1, wherein the detection unit is an optical range unit.

6. The vacuum adsorption system according to claim 1, wherein the vacuum adsorption system further includes:
   a control unit, configured to control the adjustment unit to adjust the position of the carrying platform based on the positional relationships between the adsorption units on the carrying platform and the packaging areas on the mother substrate to be packaged output by the detection unit, such that the positions of at least part of the adsorption units on the carrying platform are not overlapped with the packaging areas of the mother substrate to be packaged.

7. The vacuum adsorption system according to claim 1, wherein the vacuum adsorption system further includes:
   a vacuumizing device, configured to enable the mother substrate to be packaged to be adsorbed and fixed on the carrying platform through adsorption holes on the vacuum adsorption platform and the adsorption units on the carrying platform.

8. A packaging device, wherein the packaging device includes a vacuum adsorption system for a mother substrate to be packaged, which includes a vacuum adsorption platform, wherein the vacuum adsorption system further includes:
   a carrying platform, which is provided on the vacuum adsorption platform and edges thereof are sealed with edges of the vacuum adsorption platform, configured to carrying the mother substrate to be packaged and provided thereon with a plurality of adsorption units, the adsorption units being used for adsorbing, in cooperation with the vacuum adsorption platform, the mother substrate to be packaged so as to fix the mother substrate to be packaged;
   a detection unit, configured to detect positional relationships between the adsorption units on the carrying platform and packaging areas on the mother substrate to be packaged; and
   an adjustment unit, configured to adjust the position of the carrying platform when the detection unit detects that the positions of the adsorption units on the carrying platform are overlapped with the packaging areas on the mother substrate to be packaged, so that positions of at least part of the adsorption units on the carrying platform are not overlapped with the packaging areas on the mother substrate to be packaged.

9. The packaging device according to claim 8, wherein the plurality of adsorption units are distributed uniformly on the carrying platform.

10. The packaging device according to claim 8, wherein the structure of the adsorption unit is a round hole, a square hole or a rectangular hole.

11. The packaging device according to claim 9, wherein the structure of the adsorption unit is a round hole, a square hole or a rectangular hole.

12. The packaging device according to claim 8, wherein the detection unit is an optical range unit.

13. The packaging device according to claim 8, wherein the vacuum adsorption system further includes:
   a control unit, configured to control the adjustment unit to adjust the position of the carrying platform based on the positional relationships between the adsorption units on the carrying platform and the packaging areas on the mother substrate to be packaged output by the detection unit, such that the positions of at least part of the adsorption units on the carrying platform are not overlapped with the packaging areas of the mother substrate to be packaged.

14. The packaging device according to claim 8, wherein the vacuum adsorption system further includes:
   a vacuumizing device, configured to enable the mother substrate to be packaged to be adsorbed and fixed on the carrying platform through adsorption holes on the vacuum adsorption platform and the adsorption units on the carrying platform.

15. An adsorption method for a vacuum adsorption system for a mother substrate to be packaged, the vacuum adsorption system including a vacuum adsorption platform and further including: a carrying platform, which is provided on the vacuum adsorption platform and edges thereof are sealed with edges of the vacuum adsorption platform, configured to carrying the mother substrate to be packaged and provided thereon with a plurality of adsorption units, the adsorption units being used for adsorbing, in cooperation with the vacuum adsorption platform, the mother substrate to be packaged so as to fix the mother substrate to be packaged; a detection unit, configured to detect positional relationships between the adsorption units on the carrying platform and packaging areas on the mother substrate to be packaged; and an adjustment unit, configured to adjust the position of the carrying platform when the detection unit detects that the positions of the adsorption units on the carrying platform are overlapped with the packaging areas on the mother substrate to be packaged so that positions of at least part of the adsorption units on the carrying platform are not overlapped with the packaging areas on the mother substrate to be packaged, the adsorption method including the following steps of:

placing the mother substrate to be packaged above the carrying platform;

detecting, by the detection unit, the positional relationships between the adsorption units on the carrying platform and the packaging areas on the mother substrate to be packaged; and adjusting, by the adjustment unit, the position of the carrying platform whet the detection unit detects that the positions of the adsorption units on the carrying platform are overlapped with the packaging areas on the mother substrate to be packaged, so that positions of at least part of the adsorption units on the carrying platform are not overlapped with the packaging areas on the mother substrate to be packaged.

16. The adsorption method for the vacuum adsorption system according to claim 15, wherein, the step of detecting the detection unit the positional relationships between the adsorption units on the carrying platform and the packaging areas on the mother substrate to be packaged is a step of detecting distances between each adsorption unit on the carrying platform and a packaging area on the mother substrate to be packaged adjacent to the adsorption unit.

17. The adsorption method for the vacuum adsorption system according to claim 15, wherein, after the step of adjusting, by the adjustment unit, the position of the carrying platform when the detection unit detects that the positions of the adsorption units on the carrying platform are overlapped with the packaging areas on the mother substrate to be packaged, so that positions of at least part of the adsorption units on the carrying platform are not overlapped with the packaging areas on the mother substrate to be packaged, the method further includes the following step of:

adsorbing the mother substrate to be packaged onto the carrying platform through vacuumizing.

* * * * *